United States Patent [19]

Shah

[11] Patent Number: 4,685,087
[45] Date of Patent: Aug. 4, 1987

[54] SRAM WITH CONSTANT PULSE WIDTH

[75] Inventor: Ashwin H. Shah, Dallas, Tex.

[73] Assignee: Texas Instruments Incorporated, Dallas, Tex.

[21] Appl. No.: 528,374

[22] Filed: Aug. 31, 1983

[51] Int. Cl.$^4$ ............................................... G11C 7/00
[52] U.S. Cl. ..................................... 365/227; 365/194
[58] Field of Search ............... 365/227, 203, 230, 194, 365/210, 189, 226, 233

[56] References Cited

U.S. PATENT DOCUMENTS

| 4,231,110 | 10/1980 | Stinehelfer | 365/194 |
| 4,339,809 | 7/1982 | Stewart | 365/206 |
| 4,355,377 | 10/1982 | Sud et al. | 365/203 |
| 4,405,996 | 9/1983 | Stewart | 365/203 |
| 4,417,328 | 11/1983 | Ochii | 365/227 |
| 4,425,633 | 1/1984 | Swain | 365/194 |
| 4,435,793 | 3/1984 | Ochii | 365/210 |

OTHER PUBLICATIONS

Konishi et al., "A 64 Kb CMOS RAM", IEEE International Solid State Circuits Conference, Digest of Tech. Papers, Feb. 12, 1982, pp. 258–259, 333.
Ochii et al., "A 15 nW Standby Power 64 Kb CMOS RAM", IEEE ISSCC, Digest of Technical Papers, Feb. 12, 1982, pp. 260–261, 334.

Primary Examiner—James W. Moffitt
Assistant Examiner—Glenn A. Gossage
Attorney, Agent, or Firm—Douglas A. Sorensen; Leo N. Heiting; Melvin Sharp

[57] ABSTRACT

Static random access memory having an edge-triggered power up architecture. Each element of the signal path is powered up only during the period when it is expected to be active. Separate delays are provided to tailor the delay of the power-up pulses for each separate circuit component, and separate 1-shot pulse generators, with the pulse width tailored to the power-up duration required by each circuit element, are provided for each circuit element.

13 Claims, 7 Drawing Figures

EDGE TRIGGERED AUTO POWER DOWN FOR STATIC RAMS

SRAM WITH CONSTANT PULSE WIDTH

BACKGROUND AND SUMMARY OF THE INVENTION

The present invention relates to static random access memory.

The key desiderata in static random access memories (SRAMs) are speed, density, and power dissipation. Power dissipation is quite important, because there are typically important trade-offs between power and speed. That is, the high-current logic elements used to achieve high speed will normally imply high power dissipation, and power dissipation per unit area puts a grave limitation on density. Thus, any circuit architecture improvement which can generally reduce power dissipation will provide substantial advantages in the SRAM art.

Thus, it is an object of the present invention to provide a circuit architecture which reduces power dissipation in SRAM memories.

The use of a power down feature in high speed static RAMs allowed the system to power up a few RAM chips on a memory board and fetch data from these chips while the rest were powered down. This allowed the duty cycle for the power dissipation to be small and therefore the average active power of the chip could be increased, thereby increasing the speed of the SRAM. Since the SRAM is asynchronous in operation, the chip select or enable signals were required to serve to initiate a read or write cycle with the currently valid address. Further improvement in sRAM access time was obtained by edge-triggered operations in the address path. This operation recognized a SRAM cycle to be asynchronous, and one that could be initiated by any address transition, if the chip was selected. The transition on any address line was detected and used to generate an internal clock to be used to precharge bit lines and allow sense amplifiers to recover to the balanced state before the next cell was decoded. The use of this edge triggered (or "address transition bus" or "X-pulse") technique is quite widespread in many state-of-the-art SRAMs, serving the purpose described above.

This approach reduces the power consumption of a chip, and therefore permits higher speed elements to be used without violating the constraints on average power dissipation per unit area averaged over the thermal relaxation time. However, even in this approach, elements are powered up for significant amounts of time when they are not actually in the signal path. For example, in a sample state-of-the-art SRAM technology, after an address transition (when the row and/or column address inputs provided at the external pins of the memory package change), it will typically take 2 to 5 ns for the address buffer to change state, 4 to 5 ns more for the row decoder to change state, and 4 to 5 additional ns before the past transistors in the row-selected memory cells in each column are open. Typically, another 15 to 20 ns will be required for the sense amplifier to change state. The column decoders require only 5 or 6 ns, after they have received the address, to raise a line connecting the sense amplifier of the selected column to the output buss. Thus, the sense amplifer is not actually in the signal path until 10 ns or so after the address buffer changes state. The column select logic is not actually in the single path until about 25 ns after the address buffer changes state. Moreover, the row decode logic is not in the signal path for more than about 10 or 15 ns after the address buffer has changed state. Thus, in the prior art all of these logic elements must be powered up during most of the read cycle, i.e., for 40 ns or more (until a first stage of the output buffer has changed state). This means that excessive power is being consumed. That is, each individual element in the signal path is being powered up for a total time which is much more than the time during which it is actually required to perform its function. While any individual element absorbs only a small amount of electrical energy during this excess power-up time, the net effect of this is that the total power dissipation of the peripheral elements is several times that required, and the average power dissipation of the SRAM (i.e., cell power dissipation plus peripheral power dissipation) is unnecessarily increased.

Thus, it is an object of the present invention to provide an SRAM wherein power dissipation in the peripheral circuits is minimized.

It is a further object of the present invention to provide an SRAM wherein the power dissipation in the peripheral circuits is not substantially larger than that strictly required for power-up of each circuit element during propagation of the signals.

The present invention differs from the conventional use of the address transition detection in the use of the clock to power up the signal propagation path synchronously with respect to the signal flow and in the use of the internal critical path timing elements to synchronize the power up times with the signal flow times, thereby reducing the active power dissipation cycle to the very minimum possible without degrading the speed of the SRAM. Since the timing elements used are identical for the signal and power path, they track each other over process variations and over temperature variations. In particular, dummy elements are used (such as dummy column address decoders) to provide the appropriate delays for the asynchronous power-up signals to activate the corresponding power elements, such as the actual column decoders. By this innovation, exact matching of the asynchronous signals to the appropriate delays needed to activate the power elements are perfectly tailored. That is, process variations which may cause changes in the propagation speed of logic elements will be mirrored by the propagation speed of the dummy elements so that the asyncronous power-up signals will still be provided to the actual power logic elements at the right time.

In the presently preferred embodiment, not only is the delay used to trigger the power-up input of each circuit element separately tailored for each circuit element, but also the duration of the power-up pulse provided each circuit element is also separately tailored. That is, a one-shot constant-width pulse generator is used to provide the power-upsignal to each circuit element, and the width of the pulse provided by the one-shot pulse generator is also tailored.

According to the present invention, there is provided:

A static random access memory comprising:
an array of memory cells arranged in rows and columns;
address decoder means for receiving a plurality of address bits to select a particular one of said memory cells;
said address decoder comprising a row address decoder to decode bits of said address bits corresponding to a row of said array, and a column address decoder to decode bits of said address bits corresponding to a column of said array; and power-up means, connected to said address bits and to said row and column address decoders, for detecting a transition in said address bits and for powering up said row decoder first and subsequently powering up said column decoder, whenever a transition in said address bits is detected;

wherein said power-up means provides a pulse having a predetermined duration of said row decoder and provides a pulse having a second predetermined duration different from said first predetermined duration to said column decoders.

BRIEF DESCRIPTION OF THE DRAWINGS

The present invention will be described with reference to the accompanying drawings, or.

DETAILED DESCRIPTION OF THE PREFERRED EMBODIMENT:

The present invention will be described with reference to a static random access memory using conventional six transistor cells, and the decoders, sense amplifiers, and other peripheral circuits are in most respects conventional. However, the power-up signals for the address buffers, decoders and preamplifiers are governed by delayed asynchronous power-up signals as set forth below.

Figure 3:
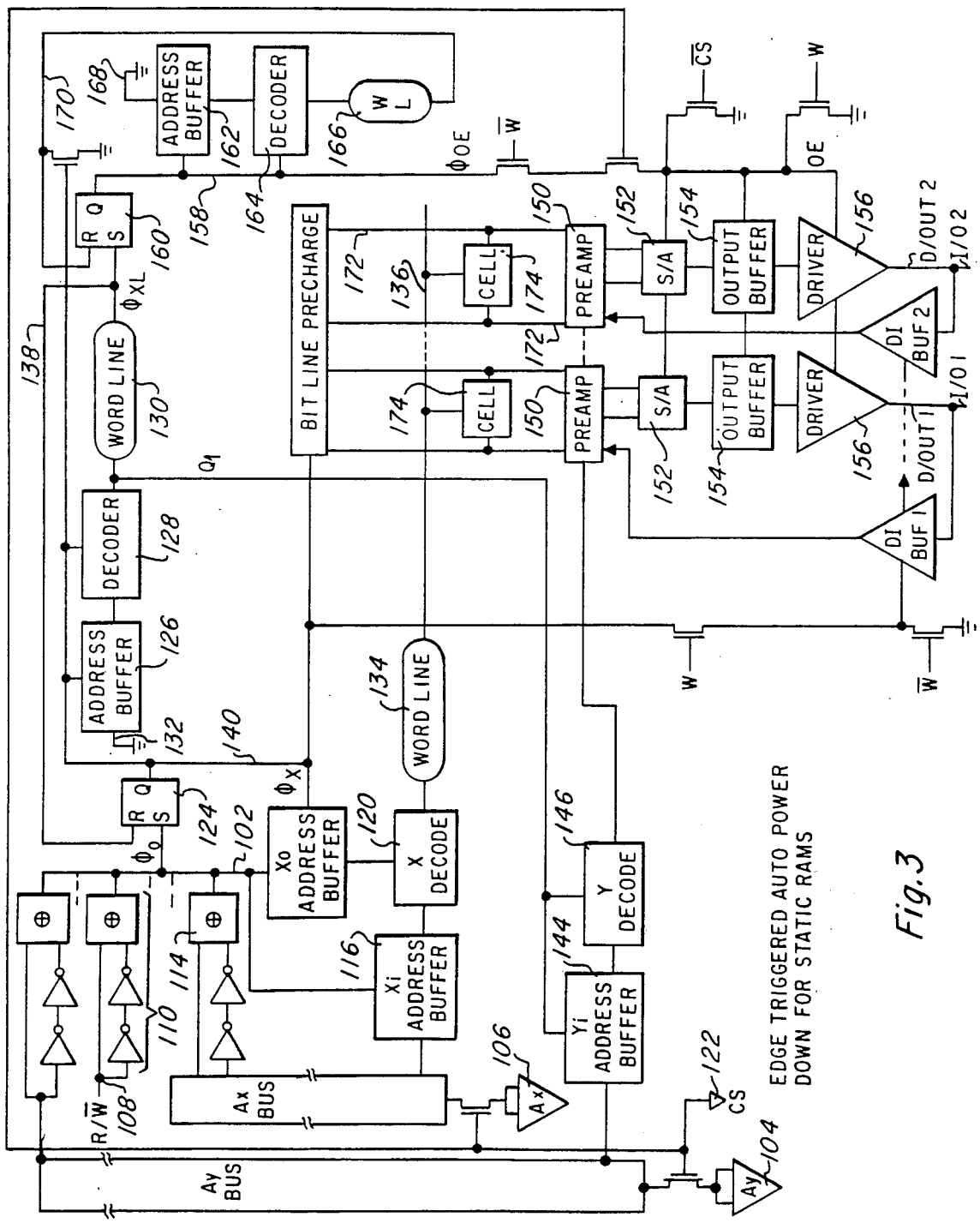
FIG. 3 shows the organization of a static random access memory accorded to the present invention, incorporating delayed logic to provide a highly power-efficent asynchronous architecture, wherein elements in the signal path are powered up for only as long as required.
Figure 5:
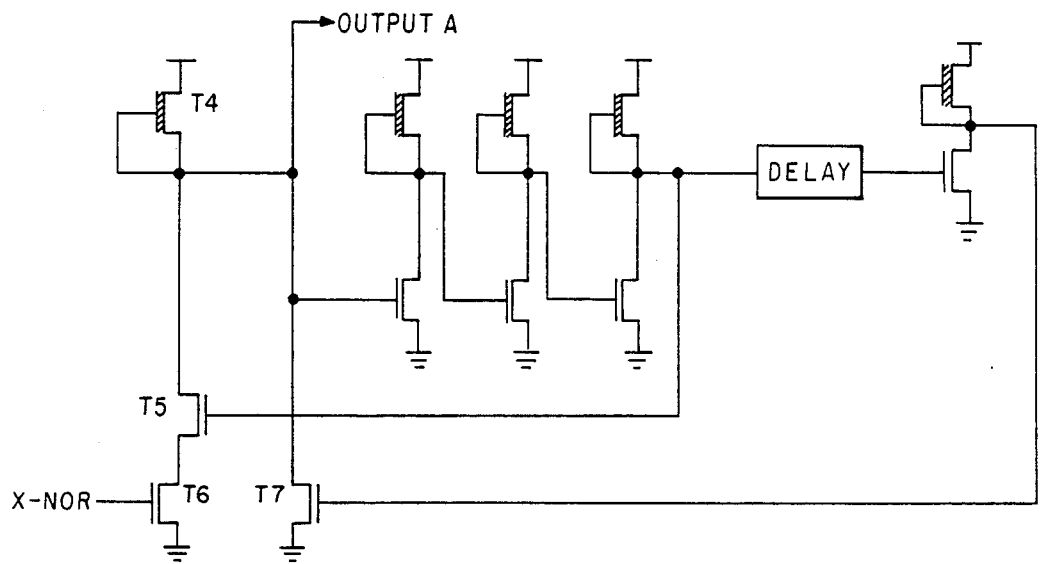
FIG. 5 is a more detailed circuit diagram of the constant pulse width generator at FIG. 1C.

The architecture of the sRAM according to this invention is shown in FIG. 3. All address lines, and the read/write lines are gated by chip select and connected to an edge detect circuit consisting of a delay element and an exclusive OR logic, the output of which forms a common bus which detects the transition in any address or in read/write when the chip is selected. This signal is defined as PHIO as shown in FIG. 4.

The use of the chip select gating and the inclusion of the read/write signal on the transition detection buss are features of this invention which are different from the traditional architecture. However, the transition detector is architecturally the same as in a conventional edge triggered SRAM. The conventional SRAMs use the signal PHIO to perform presetting functions and equilibrating functions on the SRAM bit line and sensing circuits, to improve speed. In the architecture according to this invention, even though chip select is high, only a transition in the address or read/write which is larger than the delay element in the transition detector will initiate a power up chain. The signal PHIO immediately powers up the x-address buffer and allows the x-address to propagate through. This is the first element in the critical path of the SRAM and must be powered up as soon after the address transition as possible. The delay in this power up signal is determined by the delay in the transition detector circuit and is determined by the amount of noise rejection desired on the system lines. This is because the noise glitches in the system lines can be interpreted as address transitions by the SRAM. This problem is, of course, common to all edge triggered architectures. The PHIO pulse also initiates a delay chain by setting a flip flop, the output of which powers up a dummy address buffer, decoder and word line driver with a preset signal (shown as ground in FIG. 3). This timing chain consists of elements identical to that of the actual signal flow through the set of address buffers, decoders and word line drivers, and work lines, so that the delay will track.

That is, it is preferably but not necessary that actual logic elements be used in a dummy path (i.e., in the power-up control path) to emulate the same logic elements used in the actual signal path. This means that a precise timing emulation will be provided without the designer having to calculate timings. It also means that the delay provided will be insensitive to process variations, since the delay characteristics of the dummy elements will exactly track those of the signal-path elements. However, it is also possible, although not preferred, to use delay elements instead of exact duplicate elements. In particular, while it is possible to emulate the word line with a polysilicon meander line having the same total length and including the same length over moat, it is preferable to emulate the word line merely as a somewhat shorter polysilicon line connected to a capacitor, to provide approximately the same RC time constant.

Figure 4:
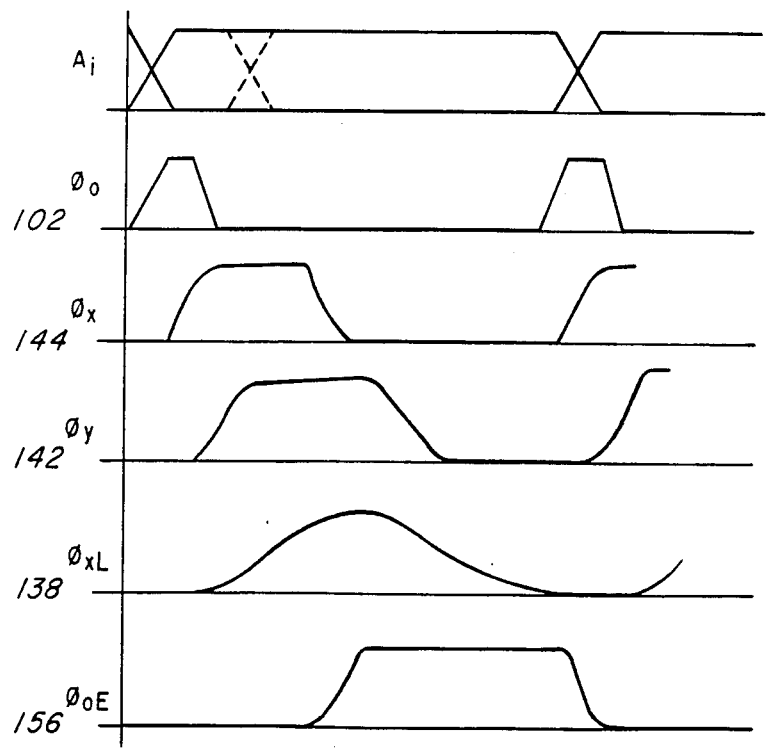
FIG. 4 is a timing chart of waveforms appearing at the marked points in the layout of FIG. 3.

The dummy path has a predetermined signal so that the output PHIXL goes high to reset flip flop 1 whose output is the signal PHIX shown in FIG. 4. This signal is used to hold the power in the address buffers long enough to allow the X-decode circuit to drive the proper word line and access the cell which puts the data on the bit lines. Simultaneously, PHIX also powers up the X-decode and the bit line precharge circuits, and the data in buffers if the chip is in a write mode.

The column address in the SRAM is not in the critical timing path, since it is required only after the word line has gone high. The power up signal for the column path is therefore activated after the X-address (row address) signal has arrived at the X-decoder. This is very simply done in the X-power up chain by tapping of the PHIX signal after the dummy decoder in the timing generator path. The PHIY signal then has a timing relationship with respect to the PHIX signal as shown in FIG. 4. This timing signal powers up the Y address buffer and the Y address (column address) decoder during the period when the X-word line is being driven, and holds the decoder output until the word line is fully activated, after which it is powered down. Thus it is powered up just long enough to determine which bit line the data must be taken from.

The second power timing chain that is activiated by the signal PHIXL is identical to the first timing chain. This timing chain is used to define the power-up signal for the sense amplifier and the output driver circuit if the chip is in the read mode. The power up timing is also generated using the word line delay because the fall time of the previously selected word line determines the deselect time, and the sense amplifier/output circuit must hold the output data till the next cell is selected. The PHIOE signal shown in FIG. 4, is used to power up the pre amp, sense amp and the output buffer in the period during which the data of the bit lines is propagated through this section. The sensing circuit is preferably of a latching type so that the data can be held after the column and row circuits are powered down. The use of a latching sense amp also preserves the output valid when the rest of the SRAM has completed the power up cycle, if another transition is not detected. This allows the asynchronous fully static operation from the system point of view to be preserved. Thus the output data is preserved via the power in a small latch rather than having the entire SRAM powered up to hold the data. Thus the duty cycle over which the active circuits are powered up are equal to the time required for them to propagate the signal through, thus making them most efficient in the use of power in the SRAM.

That is, the location of the first latch determines how much of the SRAM must remain powered up to keep the output data valid. The present invention permits circuits prior to the first latch to be powered down. The presently preferred embodiment uses a latching sense amplifier, so that the sense amplifier and output buffer must remain in a power-up condition, after an address transition, for as long as the chip is enabled. However, this is not a necessary element of the present invention. In particular, an alternative embodiment of the present invention uses a latching output buffer, and controls all circuits prior to the output buffer (row decoder, column decoder, and sense amplifiers) with asynchronous power-down signals according to the present invention, so that, when the chip remains enabled after an address transition but no further address transition has occurred, power is drawn only by the output buffer, which is itself sufficient to hold the output data valid.

As noted above, a further novel feature of the present invention is that the write enable bit is one of the bits connected to the address transition edge detector, to initiate an asynchronous power-up cycle according to the present invention. Asynchronous power-up operation is particularly advantageous in the write mode, where large power dissipation densities will occur in some of the peripheral circuits. However, in this case it is necessary to provide a power-down architecture which will allow for the case where a single bit is written immediately after it has been read. In this case, only a write enable bit would change state. This condition is adequately treated by the present invention, but is is not adequately treated by all prior art circuits.

· A further alternative embodiment of the present invention uses a different set of dummy elements to determine the delays used during the write mode. That is, in the write mode (in this embodiment) the column decoder must be powered up before the sense amplifier, rather than vice versa. Preferably, the row decoder will still be powered up first of all.

The present invention has been discussed with primary reference to static random access memories, since it is in static random access memories that critical constraints on power dissipation are combined with the relatively predictable signal path. Without regard to whether any particular memory technology may be generally referred to by those skilled in the art as a "static RAM", it may be noted that the present invention is applicable to any memory having fully static (i.e., not externally clocked) operation. Dummy elements are used to define the proper delays, so that peripheral circuits in the signal path are powered up only as needed. Preferably separate power-up timings are provided for the read mode and for the write mode.

It should also be noted that the designations of "row decoder" and "column decoder" used above are defined merely so that the "row decoder" is the one which has the longer delay, i.e., which is in the critical timing path. In conventional art, the row decoder drives word lines which are typically polysilicon or polycide, and therefore have a long time consonant. These word lines are usually shown in drawings of an array as running horizontally across the array. However, regardless of which axis of the array is drawn as horizontal or which axis of the array is referred to by the manufacture as a "row", the term "row" as used in the present specification and claims refers to the axis of the array along which the access time is in the critical delay path.

For fully minimized power consumption, and also to avoid disturbance caused by noise on the address line, it is preferable to use a constant-width pulse to power up each of the separate elements. That is, the column decoders will see a power-up pulse which has a width tailored to the needs of the column decoders and a delay tailored to the typical delay between row-access time and column-access time. The column preamplifiers will receive a pulse of longer width and less delay. The row decoders will receive a pulse which is not delayed, but which has quite a long duration, tailored to the typically long time constant of the typically polysilicon or polycide wordline.

Figure 1A:
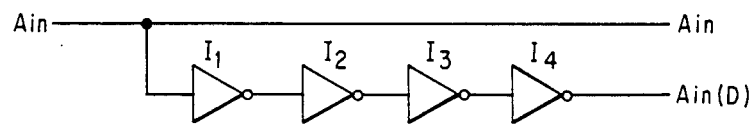
FIG. 1A shows a chain of inverters used to provide a delayed address signal course corresponding to each input address bit.
Figure 1B:
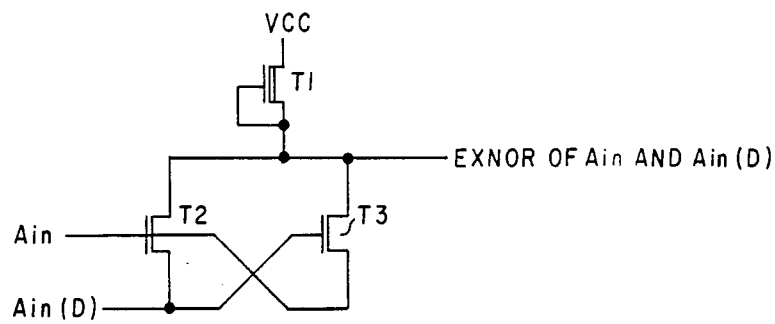
FIG. 1B shows a conventional exclusive nor edge-triggered transition detector for address buses.
Figure 1C:
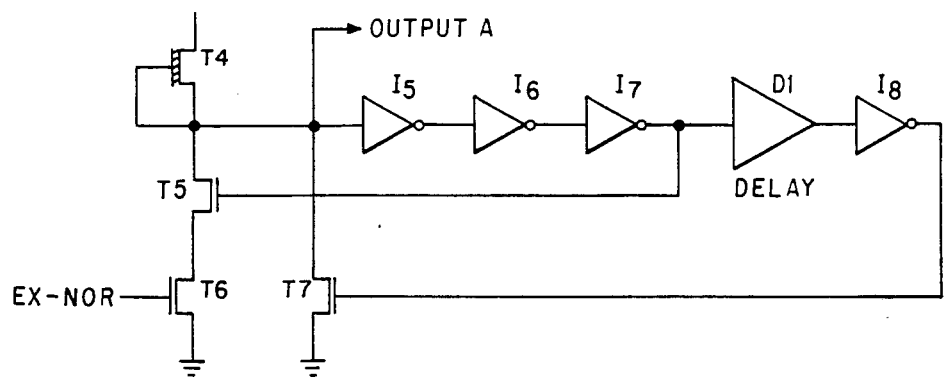
FIG. 1C shows the constant pulse width generator used in the presently preferred embodiment.

This is preferably accomplished using a one-shot circuit such as shown in FIG. 1C, and preferably embodied in a static random access memory organization such as shown in FIG. 3. However, the present invention can also be organized in many other memory layouts. The present preferred embodiment of the invention uses static random access memory having completely conventional six transistor cells, sense amplifiers, row decoders, column decoders, etc., but the present invention can also be embodied in new architecture and device designs as those are introduced.

To accomplish a pseudo-static approach to the peripheral circuits, where the peripheral circuits are powered up only where one or more input addresses change, the prior art usually employs an exclusive -OR circuit at the address inputs, the output of which is an X-OR of Ain and Ain(D) or delayed Ain. Thus the output of this circuit is a pulse as wide as the delay introduced in the address input signal.

The circuit described herein generates a pulse whose width is more or less constant.

The circuit described here is shown in FIG. 1C. Following is an explanation of its operation along with a chain of inverters $I_1$–$I_4$(FIG. 1A) and an Ex-NOR (FIG. 1B).

Figure 2:
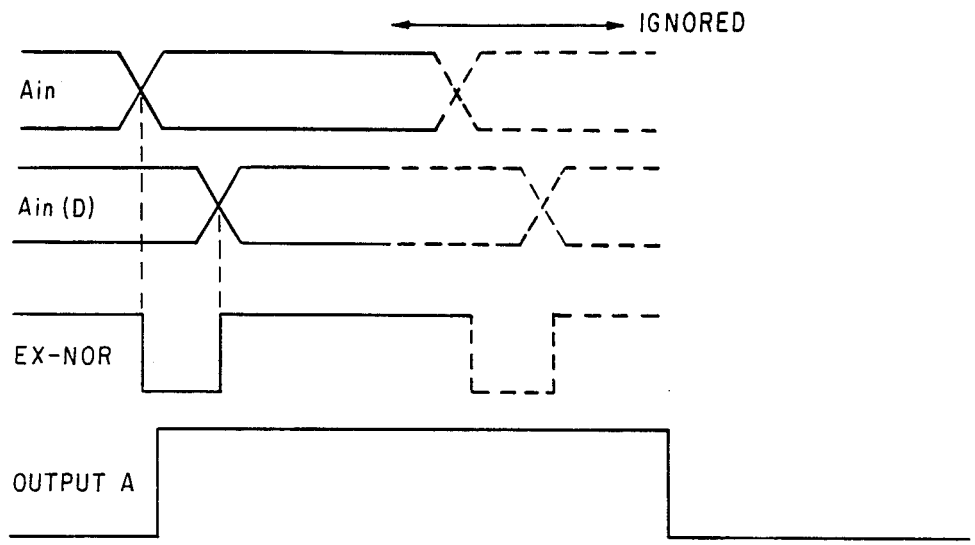
FIG. 2 shows wave forms resulting from the constant pulse width generator FIG. 1C, wherein noise on the address lines does not truncate or extend the pulse width generator.

The chain of inverters $I_1,I_2,I_3,I_4$ of FIG. 1A generate Ain (D) from Ain (See FIG. 2). These two, Ain and Ain(D) are the inputs to the exclusive NOR gate of FIG. 1B. This is a fairly extensively used configuration for X-NOR gate.

The output of EX-NOR gate is normally high. This output goes low when Ain changes. It stays low until the change in Ain shows up at Ain (D) input. At that point the EX-NOR output goes high. This is shown in FIG. 2 as well.

This EX-NOR output goes to the gate of T6 in FIG. 1C. Assuming that the output A is low at the beginning, devices T5 and T6 will be both on since EX-NOR is normally high and the gate of T5 is an inversion of output.

Now when the address input changes, and when the EX-NOR goes low, T6 turns off. As soon as T6 turns off, the output A starts going high since it is logically a NAND function of EX-NOR output and a delayed inversion of itself. Also, this high level on output A shows up as a low level on the gate of T5 after a delay due to inverter $I_5, I_6, I_7$.

Thus, in a sample embodiment of the present invention, in a 16K SRAM having 2-3 micron geometries, the pulse width supplied to the row decoders is 15-20 nanoseconds. The power-up pulse provided to the column decoders is preferably 9-12 nanoseconds long and is delayed by 10-15 nanoseconds from the start of the power-up pulse provided to the row decoders. The power-up pulse provided to the sense amplifiers is preferably 10-15 nanoseconds long and is delayed by 10-15 nanoseconds from the start of the row decoder power-up pulse.

The constant pulse width generator can help eliminate this noise problem to certain extent. Once a X-NOR output going low has been detected the power-up pulse will start and "Latch-in" to provide constant width. Once it is latched in (through NAND) the X-NOR input to the NAND will be ignored until the NAND gets reset after the power-up pulse has gone away. Thus, the address latched into the buffers will be the ones available on the pin a short time before the power-up pulse goes active. This avoids any address skew ("noise") related problems.

As will be apparent to those skilled in the art, the present invention can be widely modified and varied, and is therefore not limited except as specified in the accompanying claims.

What is claimed is:

1. A static random access memory comprising:
   (a) an array of memory cells arranged in rows and columns having associated circuit means;
   (b) address decoder means for receiving a plurality of address bits to select a particular one of said memory cells;
   (c) said address decoder comprising row address decoder means to decode bits of said address bits corresponding to a row of said array, and column address decoder means to decode bits of said address bits corresponding to a column of said array; and
   (d) power-up means, connected to said row and column address decoder means and to said associated circuit means, responsive to a transition in said address bits for initially powering up said row decoder means, subsequently powering up said column decoder means, then powering up said associated circuit means and powering down said row decoder means and said column decoder means and then powering down said associated circuit means;
   (e) said power-up means comprising means to provide a first signal having a first predetermined duration to power up said row decoder means;
   (f) first signal delay means having a predetermined delay corresponding to said row decoder means;
   (g) means responsive to said first signal to activate said first delay means;
   (h) means responsive to a first predetermined delay in said first delay means to power up said column decoder means; and
   (i) means responsive to a second predetermined delay in said delay means to power down said row decoder means and column decoder means and to power up said associated circuit means.

2. The memory of claim 1, wherein each said column of cells comprises a sense amplifier, and wherein said power-up means is connected to said sense amplifiers to power up said sense amplifiers after said row address decoder has been powered up.

3. The memory of claim 1 wherein said means responsive to a second predetermined delay is a second flip flop providing an output signal, said output signal powering up said associated circuit means.

4. The memory of claim 3 wherein said means responsive to a second predetermined delay includes a second signal delay means having a predetermined delay corresponding to said column decoder means, and output means from said second delay responsive to said second predetermined delay resetting said second flip flop.

5. The memory of claim 1 wherein said first signal delay means is a circuit substantially identical to said row address decoder means.

6. The memory of claim 5 wherein said means responsive to a second predetermined delay is a second flip flop providing an output signal, said output signal powering up said associated circuit means.

7. The memory of claim 6 wherein said means responsive to a second predetermined delay includes a second signal delay means having a predetermined delay corresponsing to said column decoder means, and output means from said second delay responsive to said second predetermined delay resetting said second flip flop.

8. The memory of claim 1 wherein said means to provide said first signal comprises means responsive to an input signal to power up said row decoder means, a first flip flop responsive to said input signal to provide an output signal, said output signal further powering up said row decoder means and said first signal delay means.

9. The memory of claim 8 wherein said means responsive to a second predetermined delay is a second flip flop providing an output signal, said output signal powering up said associated circuit means.

10. The memory of claim 9 wherein said means responsive to a second predetermined delay includes a second signal delay means having a predetermined delay corresponding to said column decoder means, and output means from said second delay responsive to said second predetermined delay resetting said second flip flop.

11. The memory of claim 8 wherein said first signal delay means is a circuit substantially identical to said row address decoder means.

12. The memory of claim 11 wherein said means responsive to a second predetermined delay is a second flip flop providing an output signal, said output signal powering up said associated circuit means.

13. The memory of claim 12 wherein said means responsive to a second predetermined delay includes a second signal delay means having a predetermined delay corresponding to said column decoder means, and output means from said second delay responsive to said second predetermined delay resetting said second flip flop.

* * * * *